United States Patent [19]
Yoo

[11] Patent Number: 5,822,240
[45] Date of Patent: Oct. 13, 1998

[54] FERROELECTRIC RANDOM ACCESS MEMORY CIRCUITS AND STRUCTURES FOR PREVENTING FERROELECTRIC CAPACITORS FROM MEMORY FAILURE

[75] Inventor: In-kyung Yoo, Suwon, Rep. of Korea

[73] Assignee: Samsung Electronics Co. Ltd., Kyungki-Do, Rep. of Korea

[21] Appl. No.: 549,898

[22] Filed: Oct. 30, 1995

[30] Foreign Application Priority Data

Sep. 21, 1995 [KR] Rep. of Korea .................. 1995 31247

[51] Int. Cl.⁶ .................................................. G11C 11/22
[52] U.S. Cl. ............................ 365/145; 365/149; 365/175
[58] Field of Search .................... 365/145, 149, 365/175; 257/295

[56] References Cited

U.S. PATENT DOCUMENTS 5,119,329  6/1992  Evans, Jr. et al. ...................... 365/145
5,506,748  4/1996  Hoshiba .................................. 257/295

*Primary Examiner*—Son T. Dinh
*Attorney, Agent, or Firm*—Seidel Gonda Lavorgna & Monaco, PC

[57] ABSTRACT

A novel ferroelectric random access memory structure which comprises a capacitor consisting of upper and lower plane electrodes and a ferroelectric inserted therebetween, and a transistor comprising a means of inducing the capacitor to polarization and maintaining it, connected with at least one of the electrodes, wherein the electric potential of the upper electrode is equalized with that of the lower electrode, thereby preventing the polarization reversal caused by pyroelectric charges.

15 Claims, 9 Drawing Sheets

GROUNDING

FLOATING

FERROELECTRIC RANDOM ACCESS MEMORY CIRCUITS AND STRUCTURES FOR PREVENTING FERROELECTRIC CAPACITORS FROM MEMORY FAILURE

BACKGROUND OF THE INVENTION

1. Field of the invention

The present invention relates to novel ferroelectric random access memory (hereinafter referred to as "FRAM") circuits and structures for preventing ferroelectric capacitors from memory failure. More particularly, the present invention relates to removal of noisy pyroelectric charges, thereby preventing ferroelectric capacitors from polarization reversal.

2. Description of the Prior Art

Polarization of ferroelectrics is attributed to electric dipole based on atom displacement, which occurs only when external electrical signals are applied.

FRAM is designed to utilize such polarization and since electrical signals are employed for detecting a polarization state, any type of electrical noise affects the operation of ferroelectric memories as far as charges are concerned.

Besides such polarization, ferroelectrics have properties which can affect electrical signals. For example, PZT-type materials shows pyroelectricity as well as ferroelectricity. Pyroelectricity is a phenomenon that charges are generated when the temperature of material is changed. Thus, constant temperature does not lead to changing the amount of charge in the ferroelectrics. However, in the case that the ferroelectric memories are operated under change of temperature, pyroelectricity may have significant influence on polarization charges which play a role of memory. For example, when a computer employing FRAMs is temporarily taken around a heater, the heat may disturb the FRAMs in the computer and finally lead the FRAMs to memory failure.

Ultimately, there is a fundamental problem in applying ferroelectric capacitor to ferroelectric memory.

SUMMARY OF THE INVENTION

Accordingly, it is an object of the present invention to overcome the above problems encountered in prior art and to provide a novel ferroelectric random access memory structure for preventing ferroelectric capacitor from memory failure.

It is another object of the present invention to provide a high performance ferroelectric random access memory structure.

In accordance with the present invention, the above objects could be accomplished by providing a ferroelectric random access memory structure which comprises a capacitor consisting of upper and lower plane electrodes and a ferroelectric inserted therebetween, and a transistor comprising a means of inducing the capacitor to polarization and maintaining it, connected with at least one of the electrodes, wherein the electric potential of the upper electrode is equalized with that of the lower electrode, thereby preventing the polarization reversal caused by pyroelectric charges.

BRIEF DESCRIPTION OF THE DRAWINGS

The above objects and other advantages of the present invention will become more apparent by describing in detail the preferred embodiments of the present invention with reference to the attached drawings in which.

DETAILED DESCRIPTION OF THE INVENTION

To understand the pyroelectric properties of ferroelectric capacitor with temperature, various experiments were carried out and the results are shown in the accompanying drawings.

First, referring to FIG. 1, there is illustrated an experiment for the polarization change of ferroelectric capacitor attributable to pyroelectric effect upon heating and cooling. FIG. 1D shows a cross section of a ferroelectric capacitor used in this experiment, which comprises upper electrode 1 and lower electrode 3 on and beneath ferroelectric 2, respectively. This ferroelectric capacitor was connected with diode and they each are grounded as shown in FIG. 1E. This resulting circuit was used as a sample for assaying pyroelectricity. Input signal for measuring hysteresis loop is shown in FIG. 1A and its corresponding output signal or hysteresis loop in FIG. 1B. Application of the input signal to the ferroelectric capacitor was carried out at room temperature. The hysteresis loop, informing the polarization state of the sample, was detected at point A of FIG. 1C, which is a thermal cycle for measuring pyroelectricity. As shown in FIG. 1C, the temperature of the sample was fast raised from room temperature to 50° C., maintained thereat for 1 sec and rapidly reduced into room temperature. Pyroelectricity was detected at point B, a region in which temperature is extremely changed ranging from 25° to 29° C. At the moment that heat was applied, the ferroelectric capacitor was connected with the diode. This experiment was also carried out with polarity reversal.

Figure 1A:
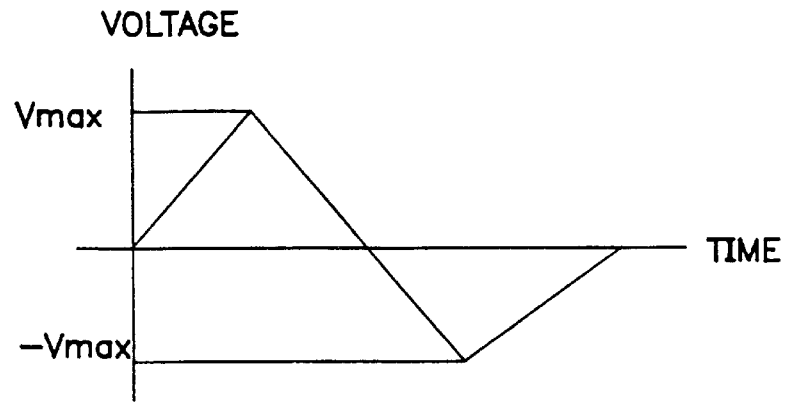
FIG. 1A shows input signal for measuring hysteresis loop.
Figure 1B:
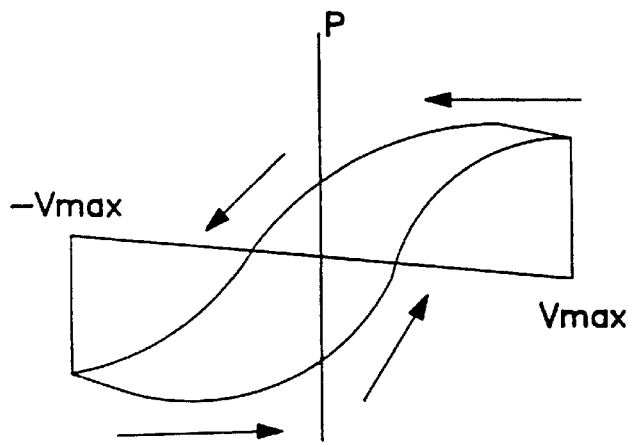
FIG. 1B shows the output signal corresponding to the input signal of FIG. 1B.
Figure 1C:
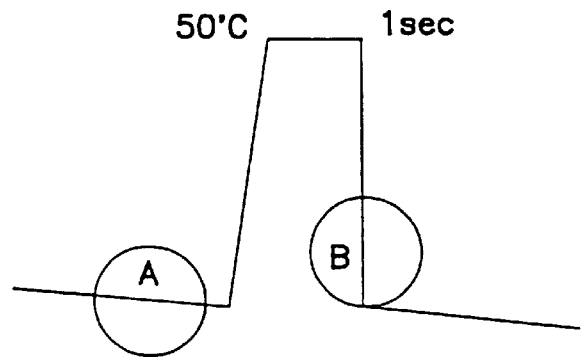
FIG. 1C is a thermal cycle for measuring pyroelectric effect of ferroelectric capacitor.
Figure 1D:
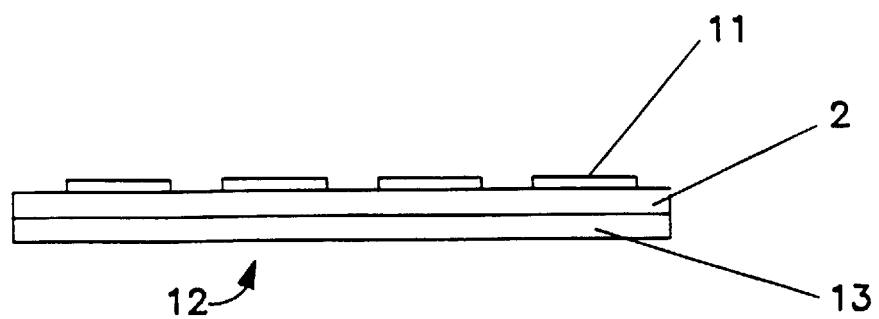
FIG. 1D is a schematic cross sectional view of a ferroelectric capacitor.
Figure 1E:
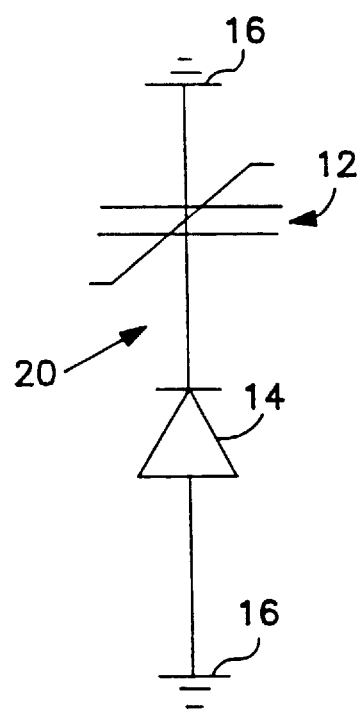
FIG. 1E is a circuit diagram showing that the ferroelectric capacitor is connected with a diode, each being grounded.
Figure 2A:
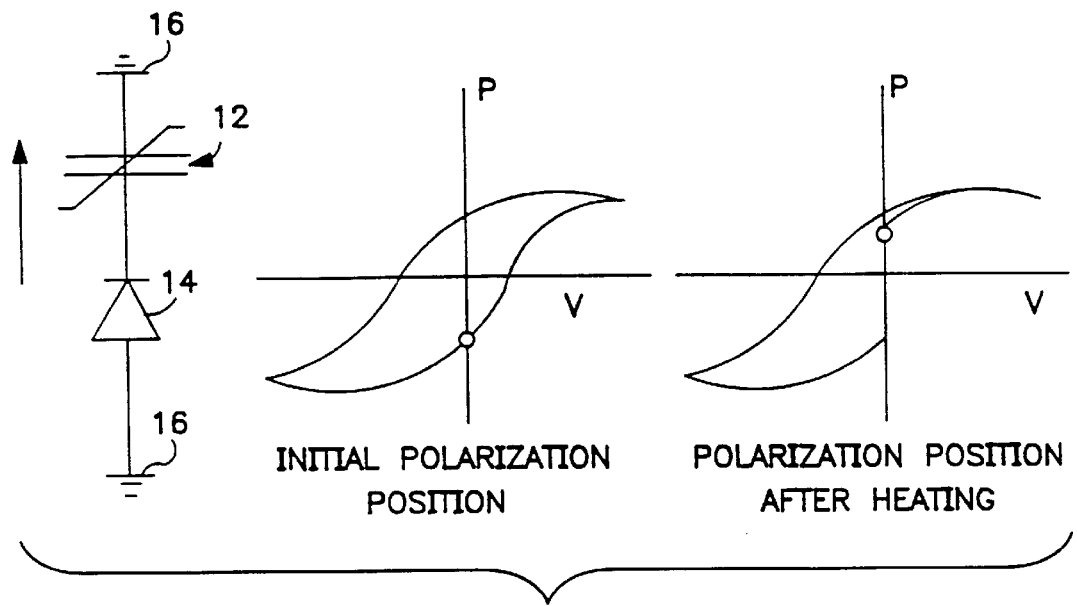
FIGS. 2A and 2B shows hysteresis loops demonstrating pyroelectric effect according to polarization direction and diode alignment.
Figure 2B:
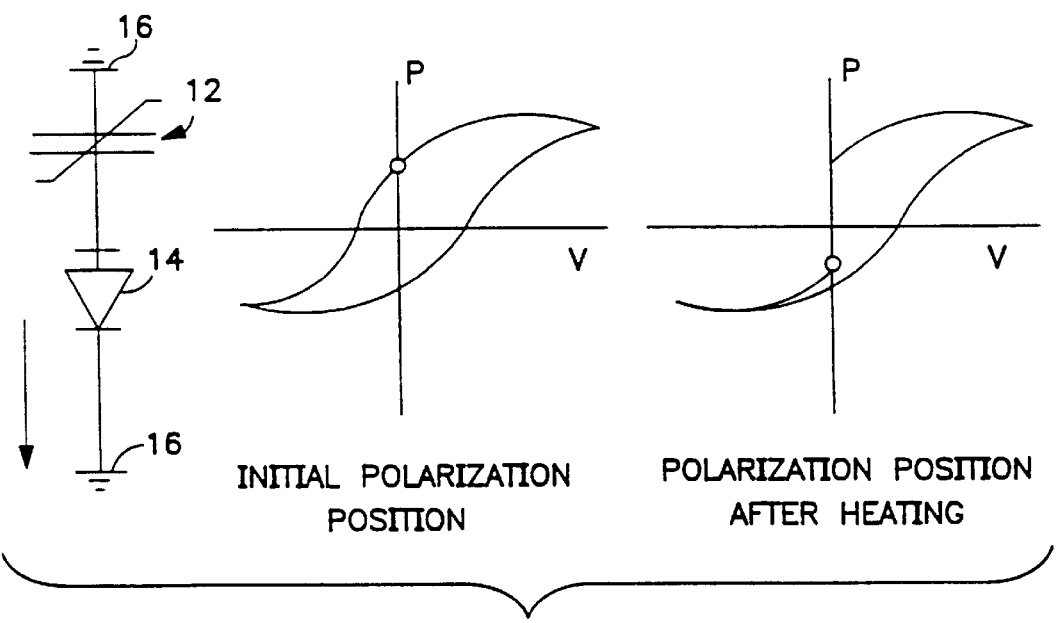

Referring to FIG. 2, there are hysteresis loops showing the pyroelectric effects according to the direction of polarization and the alignment of the diode. As shown in this figure, it was confirmed that the polarization was reversed when measuring after the sample was fast heated up to 50° C., maintained for 1 sec. and cooled into room temperature.

Such polarization reversal is believed to be attributed to a fact that the charges of pyroelectricity affect pure polarization charges. That is, when a ferroelectric is polarized, a polar domain is formed and its polarity is revered by charges generated by heat. Such polarization reversal is temporary. Application of voltage makes the pyroelectric charges disappear through circuit, leading to recovering the original polarization state. However, there remains a problem that such temporary polarization offset causes memory failure. In accordance with the present invention, it was revealed that polarization reversal did not occur at different alignments from those of FIG. 2A and 2B.

Figure 3:
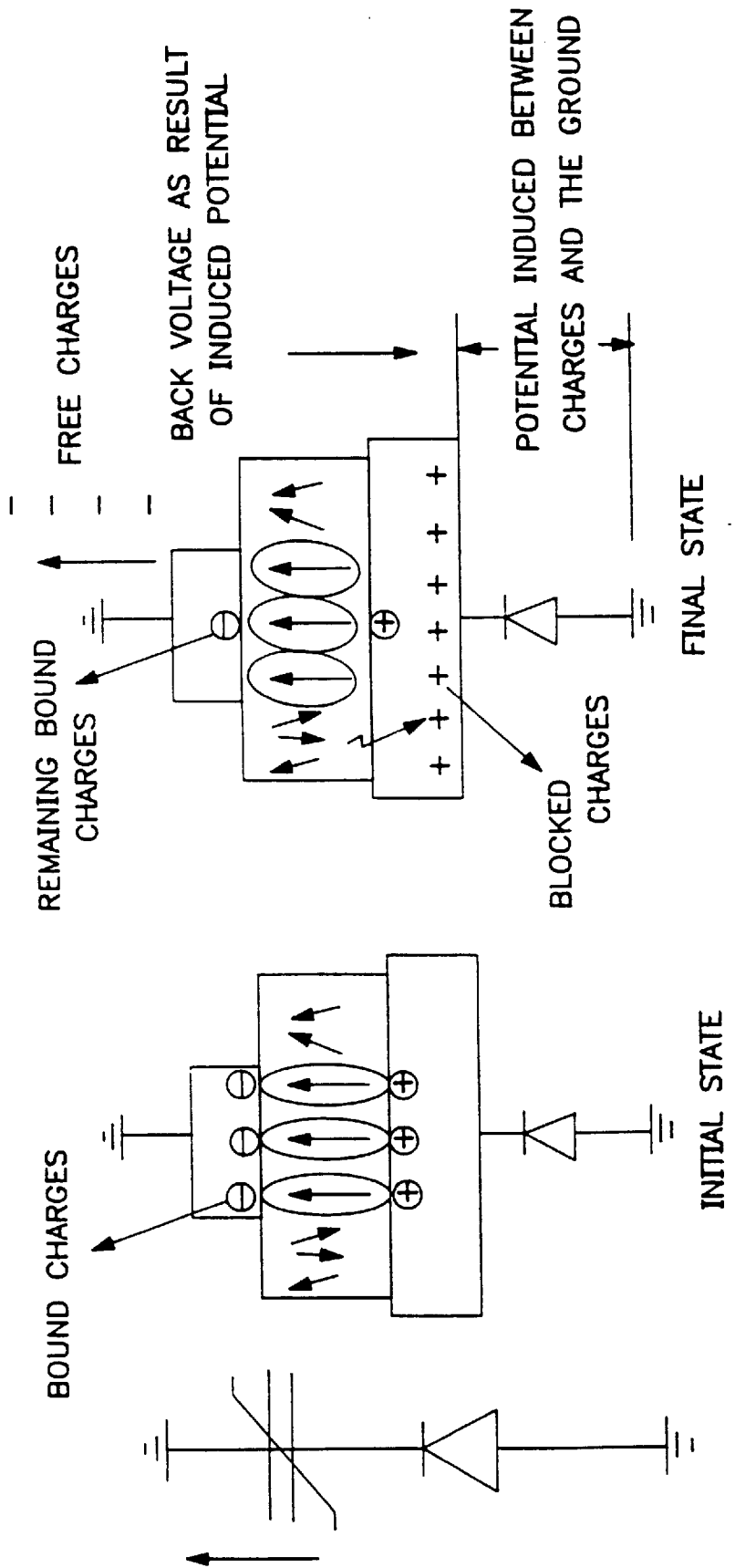
FIG. 3 schematically shows the mechanism of polarization reversal caused by pyroelectric charges occurring upon heating and cooling.
Figure 4A:
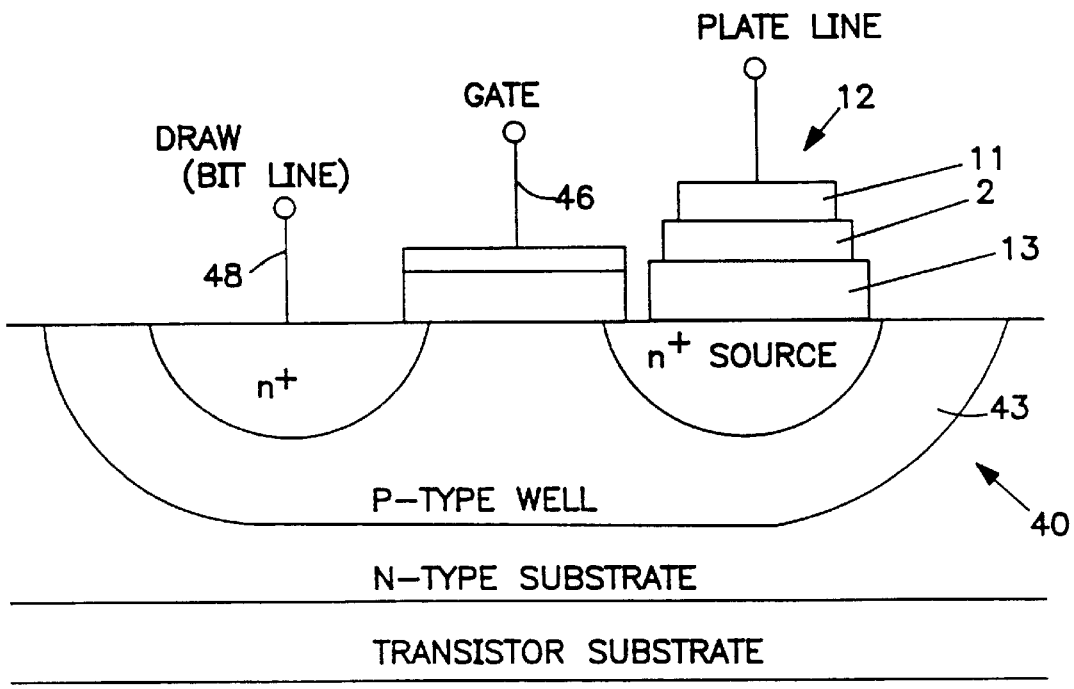
FIG. 4A is a schematic cross sectional view of a FRAM according to the present invention.
Figure 4B:
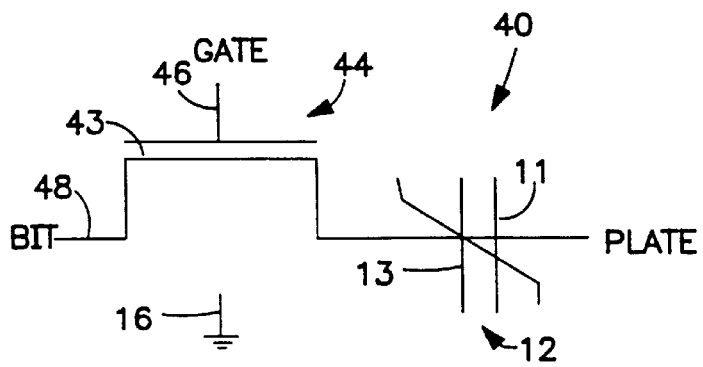
FIG. 4B is a circuit equivalent to the memory of FIG. 4A.
Figure 4C:
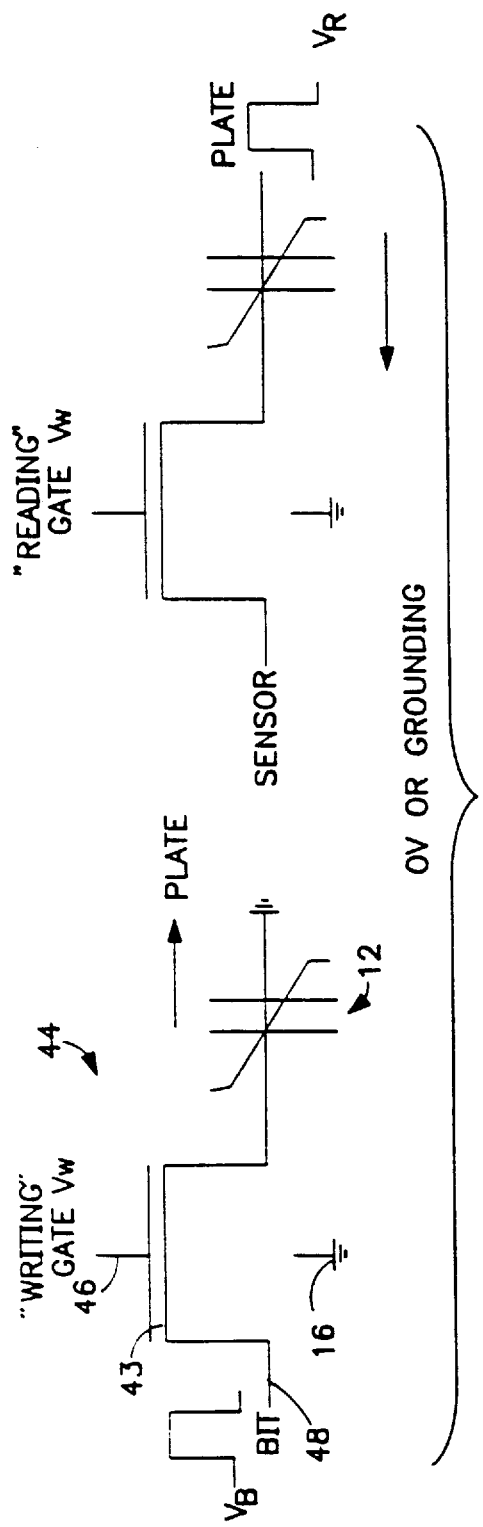
FIG. 4C shows two circuit diagrams of the FRAM OF FIG. 4B which are in the states of reading and writing, respectively.
Figure 4D:
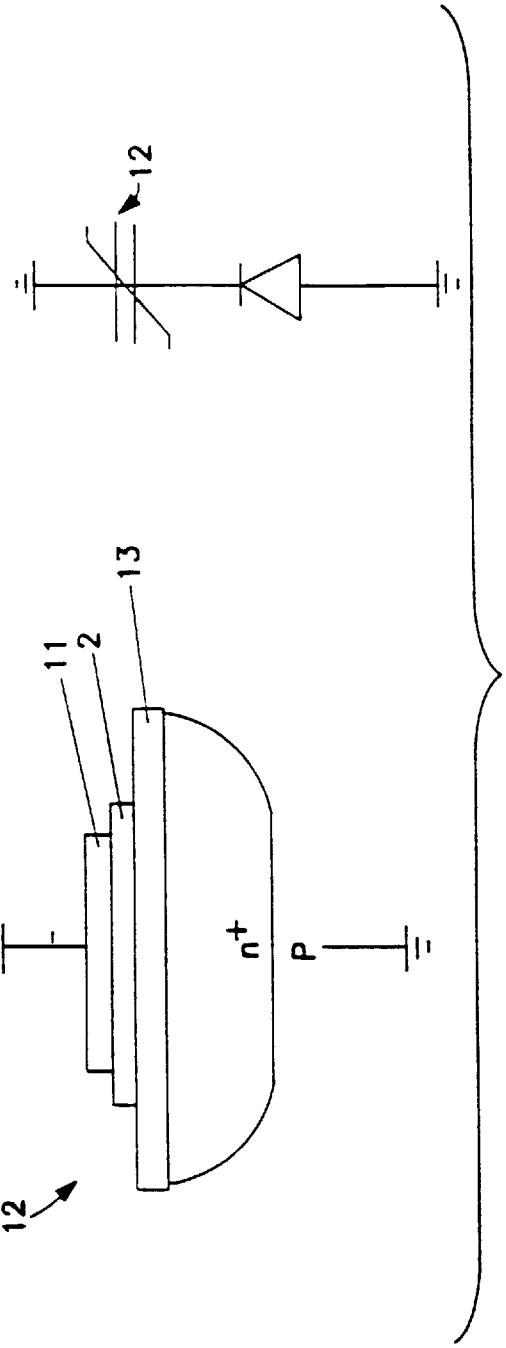
FIG. 4D shows a possible circuit diagram when the FRAM of FIG. 4B retains the information written.

With reference to FIG. 3, there is illustrated a mechanism of the polarization reversal attributable to the pyroelectric charges generated upon heating and cooling. When pyroelectric charges cannot flow into ground owing to diode, parasitic capacitance occurs between pyroelectric charges and ground, causing back voltage, which brings about polarization reversal of the ferroelectric capacitor. Therefore, if a circuit is constructed taking account of the turning point of direction upon heating and cooling, it is confirmed that the polarization reversal of ferroelectric attributable to pyroelectricity is limited within particular circuits.

FIG. 4 shows various states of a ferroelectric memory device. FIG. 4A is a cross section of ferroelectric memory device and FIG. 4B is its equivalent circuit. As shown, the ferroelectric memory comprises a ferroelectric capacitor connected with a transistor comprising gate, p-type well and $n^+$-source/drain. FIG. 4C shows two circuit diagrams of the ferroelectric memory which are in the states of reading and writing, respectively. As shown in this figure, when writing, a voltage is applied to the bit line to transmit signals to the plate. On the other hand, when reading, signals are transmitted from the plate to sensor. Accordingly, whenever signaling, the transistor is in "ON" state. At this moment, the transistor substrate is always grounded, so that a potential difference is induced between the gate and ground, thereby switching the transistor "ON" or "OFF". As apparent from the structure, it is confirmed that the ferroelectric capacitor is connected with $n^+$-p. FIG. 4D is a possible circuit diagram when the ferroelectric memory retains the information. As shown in FIG. 4C, when the ferroelectric memory maintains non-volatile memory after writing, zero voltage is applied between the bit and the plate and the p-type substrate of the transistor is in ground state. On the other hand, application of external thermal causes pyroelectric charges to be generated in the ferroelectric. At this time, the polarity of the occurring charges is determined according to the polarization direction. Negative charges flow through $n^+$-p-ground into the p-type well without causing parasitic capacitance. In contrast, positive charges do not flow through $n^+$-p-ground but are build up in the boundary, causing a voltage between the build-up charges and ground. These charges are induced in the plate by the ferroelectric capacitor, so that they lead to polarization reversal of ferroelectric capacitor. Since pyroelectric effect is dependent on the change rate of temperature and the pyroelectric coefficient of ferroelectric material, the possibility of memory failure with heat always exists. Therefore, there exists a need of an idea for preventing or avoiding the possibility of memory failure.

Figure 5A:
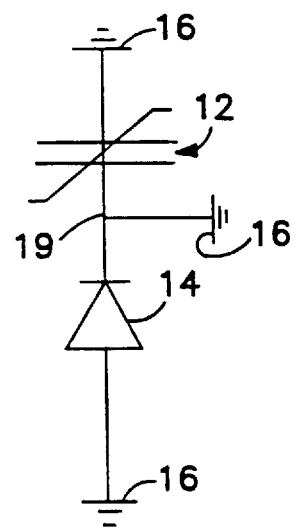
FIGS. 5A and 5B show circuit diagrams for preventing pyroelectric effect, according to the present invention.
Figure 5B:
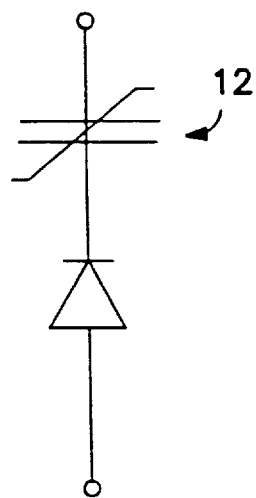

With reference to FIG. 5, there are circuit diagrams for preventing pyroelectric effect, according to the present invention. In order to prevent the pyroelectric effect, the line between the diode and the ferroelectric capacitor is grounded to remove pyroelectric charges, as shown in FIG. 5A. Alternatively, the circuit itself is floated so that pyroelectric charges may not form ground and parasitic capacitance.

Turning now to FIG. 6, there are circuit diagrams of ferroelectric memory for preventing pyroelectric effect while maintaining memory, according to the present invention.

Figure 6A:
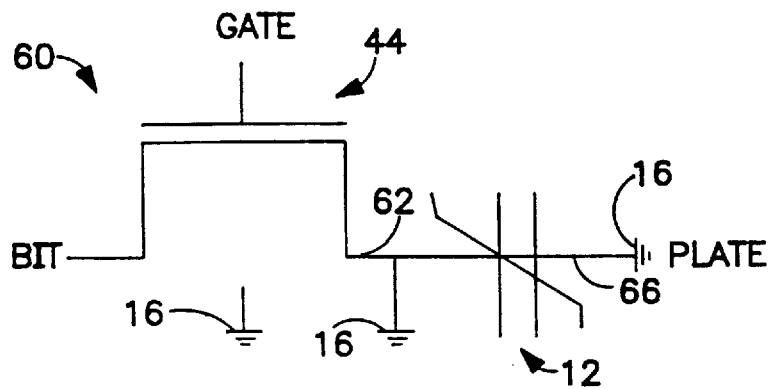
FIGS. 6A through 6D show circuit diagrams for pyroelectric effect while FRAM retains information, according to the present invention.

In one aspect of the present invention, when constructing a ferroelectric memory circuit with grounded transistor and ungrounded ferroelectric capacitor, the connection between the transistor and the ferroelectric capacitor is grounded to prevent pyroelectric effect while the ferroelectric memory retains information, as shown in FIG. 6A. That is, the charges generated by pyroelectric effect can be efficiently removed by grounding the connection between ferroelectric capacitor and transistor as well as plate line. Thus, the present invention is characterized by grounding the upper and lower electrodes of ferroelectric capacitor each to equalize the electric potential.

Figure 6B:
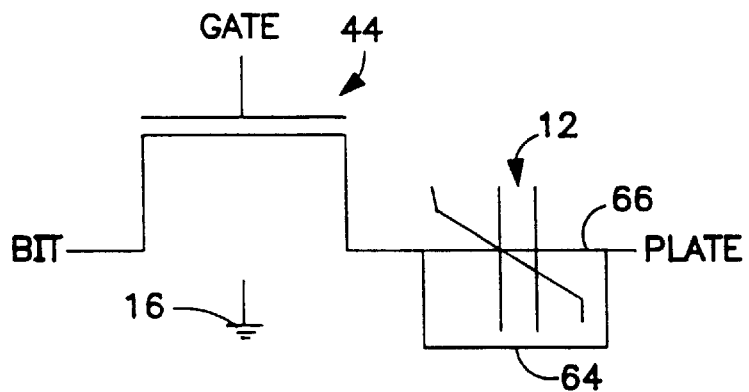

In another aspect of the present invention, while memory state is maintained, pyroelectric effect can be prevented in the circuit shown in FIG. 6B. When constructing a ferroelectric memory circuit with grounded transistor and ungrounded ferroelectric capacitor, the opposite terminals of the ferroelectric capacitor are interconnected. Thus, the present invention is characterized by connecting the upper electrode of ferroelectric capacitor with the lower electrode and grounding the connection to equalize the electric potential.

Figure 6C:
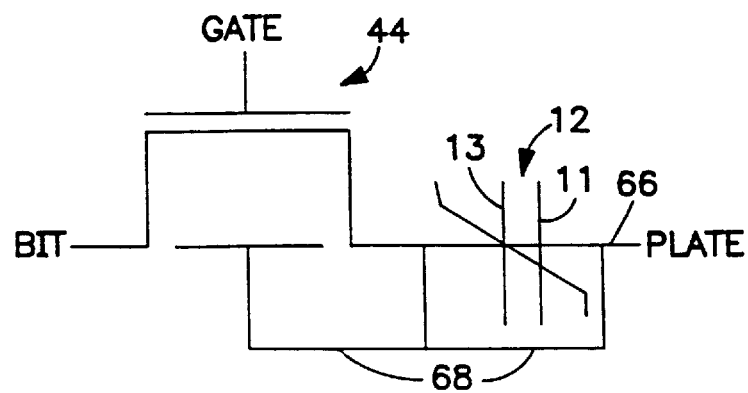

In a further aspect of the present invention, when constructing a ferroelectric memory circuit with ungrounded transistor and ungrounded ferroelectric capacitor, the transistor is connected with the opposite terminals of the ferroelectric capacitor in order to prevent pyroelectric effect while the ferroelectric memory retains information, as shown in FIG. 6C. That is, to effectively remove the charges generated by pyroelectric effect, a design is realized in such a way that the transistor substrate is connected with the opposite terminals of the ferroelectric capacitor. Thus, the present invention is characterized by uniformly distributing the pyroelectric charges between the upper and lower electrodes to equalize the electric potential.

Figure 6D:
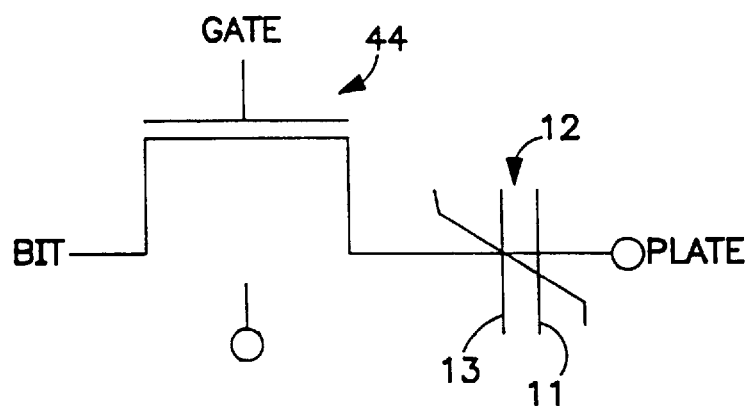

In still a further aspect of the present invention, during maintenance of memory pyroelectric effect can be prevented in the circuit shown in FIG. 6D. When constructing a ferroelectric memory circuit with grounded transistor and ungrounded ferroelectric capacitor, the prevention can be accomplished by floating the transistor and the ferroelectric capacitor. Thus, when the type and amount of pyroelectric charges generated in the upper electrode are similar to those in the lower electrode the present invention is characterized by electrically floating the upper and lower electrodes so as not to lose the pyroelectric charges on any of the electrodes, thereby equalizing the electric potential.

As described hereinbefore, the performance of ferroelectric memory can be permanently guaranteed by removing the noisy charges generated by pyroelectric effect according to the present FRAM structures for preventing polarization reversal of ferroelectric capacitor.

Other features, advantages and embodiments of the present invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A ferroelectric random access memory structure comprising:
   a capacitor consisting of upper and lower plane electrodes having a ferroelectric inserted therebetween, and
   a transistor for inducing and maintaining polarization in the capacitor, said transistor connected to at least one of the electrodes, wherein the electric potential of said upper electrode is equalized with that of said lower electrode, to prevent polarization reversal of the capacitor caused by pyroelectric charges.

2. The ferroelectric random access memory structure in accordance with claim 1, wherein said upper and lower electrodes each are grounded to remove pyroelectric charges.

3. The ferroelectric random access memory structure in accordance with claim 1, wherein said upper and lower electrodes are electrically interconnected with each other.

4. The ferroelectric random access memory structure in accordance with claim 1, wherein said upper and lower electrodes are electrically interconnected with each other and the interconnection is grounded.

5. The ferroelectric random access memory structure in accordance with claim 1, wherein said upper and lower electrodes are electrically floated so as not to lose pyroelectric charges on any of said electrodes when the type and amount of pyroelectric charges generated in said upper electrode are similar to those in said lower electrode.

6. A circuit using a ferroelectric random access memory structure comprising:
   a capacitor consisting of upper and lower plane electrodes having a ferroelectric inserted therebetween, and
   a transistor for inducing and maintaining polarization in the capacitor, said transistor connected to at least one of the electrodes, wherein the electric potential of said upper electrode is equalized with that of said lower electrode, to prevent polarization reversal of the capacitor caused by pyroelectric charges.

7. The circuit in accordance with claim 6, wherein said upper and lower electrodes each are grounded to remove pyroelectric charges.

8. The circuit in accordance with claim 6, wherein said upper and lower electrodes are electrically interconnected with each other.

9. The circuit in accordance with claim 6, wherein said upper and lower electrodes are electrically interconnected with each other and the interconnection is grounded.

10. The circuit in accordance with claim 6, wherein said upper and lower electrodes are electrically floated so as not to lose pyroelectric charges on any of said electrodes when the type and amount of pyroelectric charges generated in said upper electrode are similar to those in said lower electrode.

11. A circuit using a ferroelectric random access memory comprising:
    a capacitor consisting of upper and lower plane electrodes having a ferroelectric inserted therebetween, and
    a diode for inducing and maintaining polarization in the capacitor, said diode connected to at least one of the electrodes, wherein the electric potential of said upper electrode is equalized with that of said lower electrode, to prevent polarization reversal of the capacitor caused by pyroelectric charges.

12. The circuit in accordance with claim 11, wherein said upper and lower electrodes each are grounded to remove pyroelectric charges.

13. The circuit in accordance with claim 11, wherein said upper and lower electrodes are electrically interconnected with each other.

14. The circuit in accordance with claim 11, wherein said upper and lower electrodes are electrically interconnected with each other and the interconnection is grounded.

15. The circuit in accordance with claim 11, wherein said upper and lower electrodes are electrically floated so as not to lose pyroelectric charges on any of said electrodes when the type and amount of pyroelectric charges generated in said upper electrode are similar to those in said lower electrode.

* * * * *